(12) United States Patent
Gladwin et al.

(10) Patent No.: US 10,042,709 B2
(45) Date of Patent: Aug. 7, 2018

(54) REBUILD PRIORITIZATION DURING A PLURALITY OF CONCURRENT DATA OBJECT WRITE OPERATIONS

(71) Applicant: International Business Machines Corporation, Armonk, NY (US)

(72) Inventors: S. Christopher Gladwin, Chicago, IL (US); Jason K. Resch, Chicago, IL (US); Thomas F. Shirley, Jr., Wauwatosa, WI (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/414,338

(22) Filed: Jan. 24, 2017

(65) Prior Publication Data
US 2017/0132080 A1     May 11, 2017

Related U.S. Application Data

(63) Continuation-in-part of application No. 13/464,272, filed on May 4, 2012, now Pat. No. 9,560,133.
(Continued)

(51) Int. Cl.
*G06F 12/00*     (2006.01)
*G06F 11/10*     (2006.01)
(Continued)

(52) U.S. Cl.
CPC .......... *G06F 11/1092* (2013.01); *G06F 3/064* (2013.01); *G06F 3/067* (2013.01);
(Continued)

(58) Field of Classification Search
None
See application file for complete search history.

(56) References Cited

U.S. PATENT DOCUMENTS

| 4,092,732 A | 5/1978 | Ouchi |
| 5,454,101 A | 9/1995 | Mackay et al. |
| | (Continued) | |

OTHER PUBLICATIONS

Shamir; How to Share a Secret; Communications of the ACM; vol. 22, No. 11; Nov. 1979; pp. 612-613.
(Continued)

*Primary Examiner* — Prasith Thammavong
(74) *Attorney, Agent, or Firm* — Garlick & Markison; Timothy W. Markison; Harry S. Tyson, Jr.

(57) ABSTRACT

A method includes receiving data objects at substantially the same time for storage. The method further includes determining priority levels for the data objects. The method further includes establishing write thresholds for encoding the data objects based on the priority levels. The method further includes dispersed storage error encoding the data objects to produce pluralities of sets of encoded data slices. The method further includes executing write operations to store the pluralities of sets of encoded data slices in storage units in accordance with the write thresholds. During execution of the write operations, the method further includes identifying encoded data slices that were not properly stored and determining rebuild priorities for them. The method further includes rebuilding at least some of the encoded data slices based on the rebuild priorities.

12 Claims, 7 Drawing Sheets

Related U.S. Application Data

(60) Provisional application No. 61/493,825, filed on Jun. 6, 2011.

(51) Int. Cl.

| | | |
|---|---|---|
| *G06F 3/06* | (2006.01) | |
| *H04L 29/08* | (2006.01) | |
| *G06F 9/06* | (2006.01) | |
| *G06F 11/14* | (2006.01) | |
| *H03M 13/11* | (2006.01) | |
| *H04L 29/00* | (2006.01) | |
| *H04L 29/06* | (2006.01) | |
| *H04N 21/218* | (2011.01) | |
| *H04N 21/231* | (2011.01) | |
| *H04N 21/239* | (2011.01) | |
| *H04N 21/858* | (2011.01) | |

(52) U.S. Cl.
CPC .......... *G06F 3/0619* (2013.01); *G06F 3/0652* (2013.01); *G06F 3/0659* (2013.01); *G06F 9/06* (2013.01); *G06F 11/108* (2013.01); *G06F 11/1402* (2013.01); *H03M 13/1105* (2013.01); *H04L 29/00* (2013.01); *H04L 65/00* (2013.01); *H04L 65/602* (2013.01); *H04L 65/607* (2013.01); *H04L 67/1097* (2013.01); *H04L 67/34* (2013.01); *H04N 21/2181* (2013.01); *H04N 21/2393* (2013.01); *H04N 21/23109* (2013.01); *H04N 21/23116* (2013.01); *H04N 21/8586* (2013.01); *G06F 2211/1035* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,175,571 B1 | 1/2001 | Haddock et al. |
| 6,189,123 B1 | 2/2001 | Anders Nystrom et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,054,911 B1 | 5/2006 | Lango et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,313,693 B2 | 12/2007 | Noble et al. |
| 7,636,724 B2 | 12/2009 | de la Torre et al. |
| 8,448,227 B2 | 5/2013 | Eyal |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2005/0273686 A1 | 12/2005 | Turner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2011/0029711 A1* | 2/2011 | Dhuse ............... G06F 11/1076 711/4 |
| 2012/0207306 A1 | 8/2012 | Candelore et al. |
| 2012/0311068 A1 | 12/2012 | Gladwin et al. |
| 2013/0326264 A1* | 12/2013 | Resch ............... G06F 11/1088 714/6.2 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working—Group; RFC 4512; Jun. 2006; pp. 1-49.

(56) References Cited

OTHER PUBLICATIONS

Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 1511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

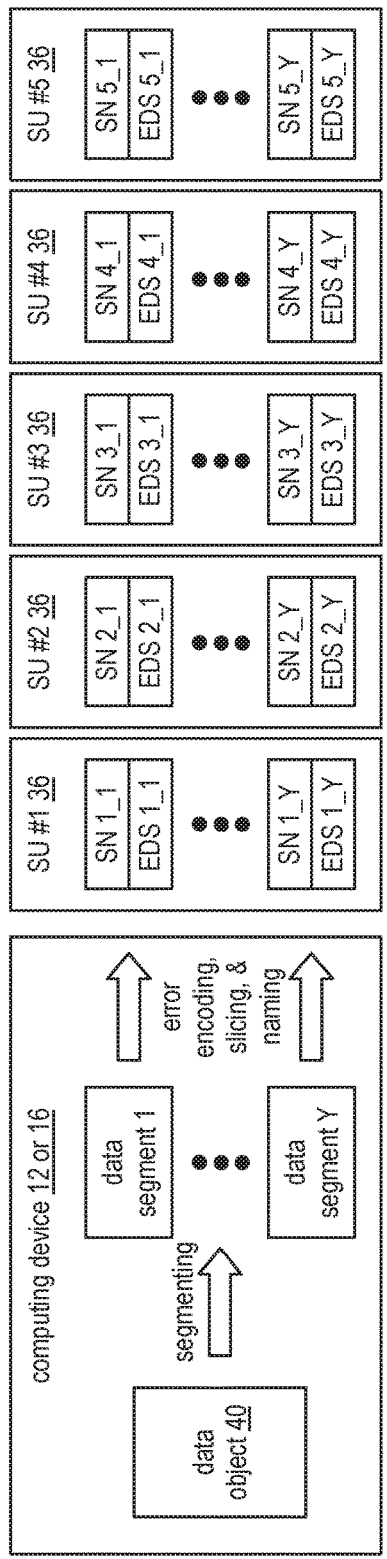
FIG. 3
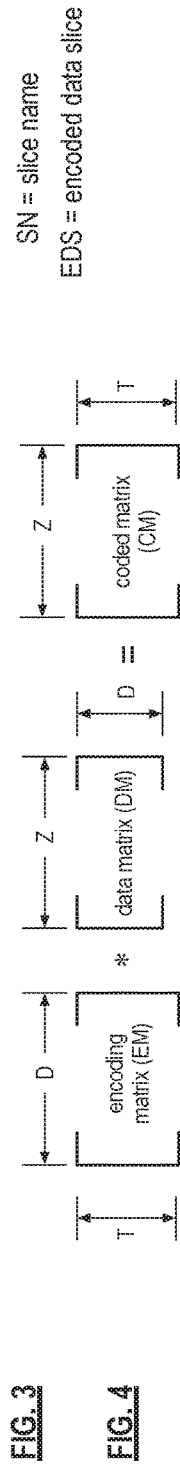
FIG. 4
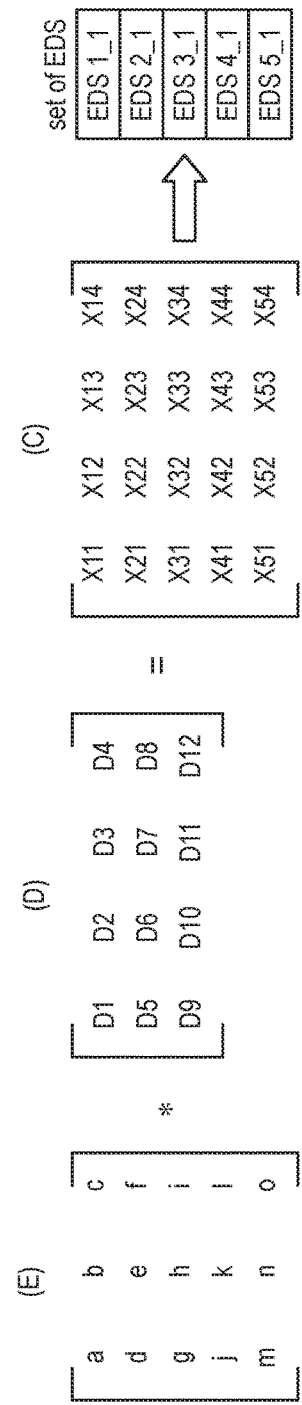
FIG. 5
| pillar # | data segment # | slice name 80 | data object ID | rev. info |
|---|---|---|---|---|
| | | vault ID | | |
FIG. 6

REBUILD PRIORITIZATION DURING A PLURALITY OF CONCURRENT DATA OBJECT WRITE OPERATIONS

CROSS REFERENCE TO RELATED PATENTS

The present U.S. Utility Patent Application claims priority pursuant to 35 U.S.C. § 120 as a continuation-in-part of U.S. Utility application Ser. No. 13/464,272, entitled "Acquiring Multi-Media Content", filed May 4, 2012, issuing as U.S. Pat. No. 9,560,133 on Jan. 31, 2017, which claims priority pursuant to 35 U.S.C. § 119(e) to U.S. Provisional Application No. 61/493,825, entitled "Accessing Data in a Dispersed Storage Network", filed Jun. 6, 2011, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

When an encoded piece of data is lost (e.g., missing, corrupted, unauthorized editing, etc.) within a dispersed storage system, the system allows for the encoded piece of data to be rebuilt. For example, when a data segment is encoded into a set of encoded data slices of which, a decode threshold number is required to rebuild the data segment, one or more of the encoded data slices may be lost. As long as there is at least a decode threshold number of encoded data slices available, the lost encoded data slices can be rebuilt. Rebuilding is a multi-step process and requires processing resources to execute.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
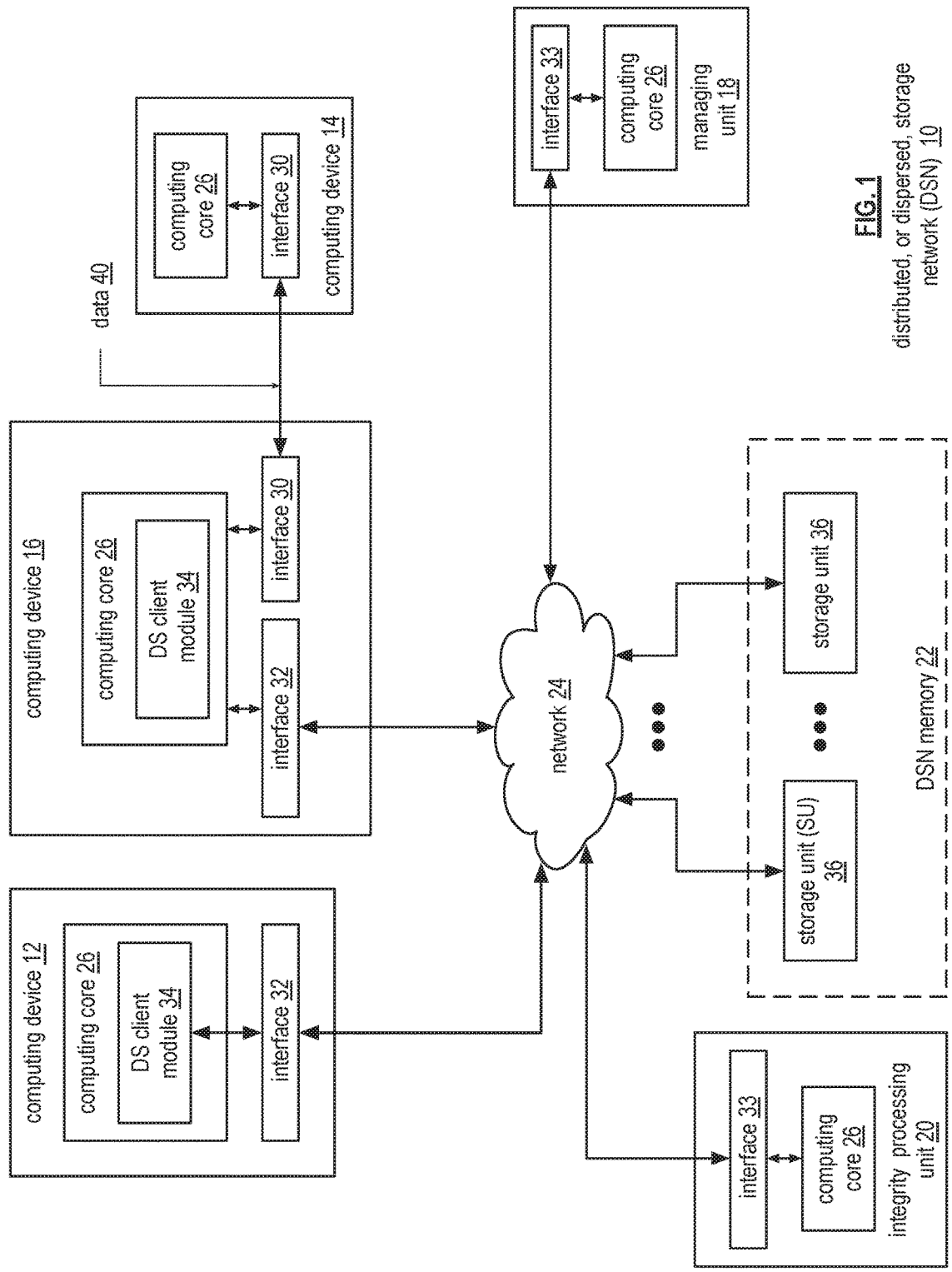
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
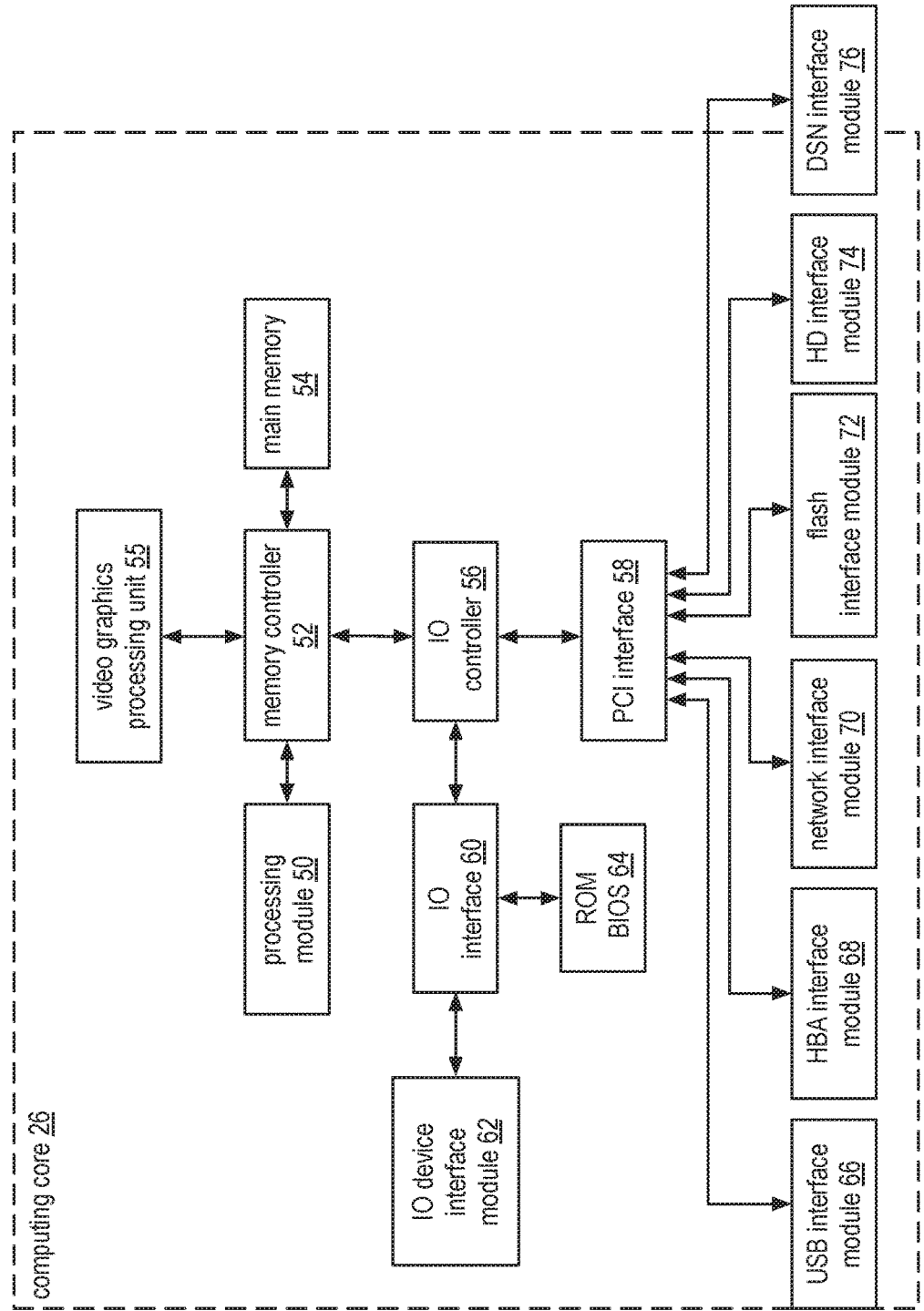
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
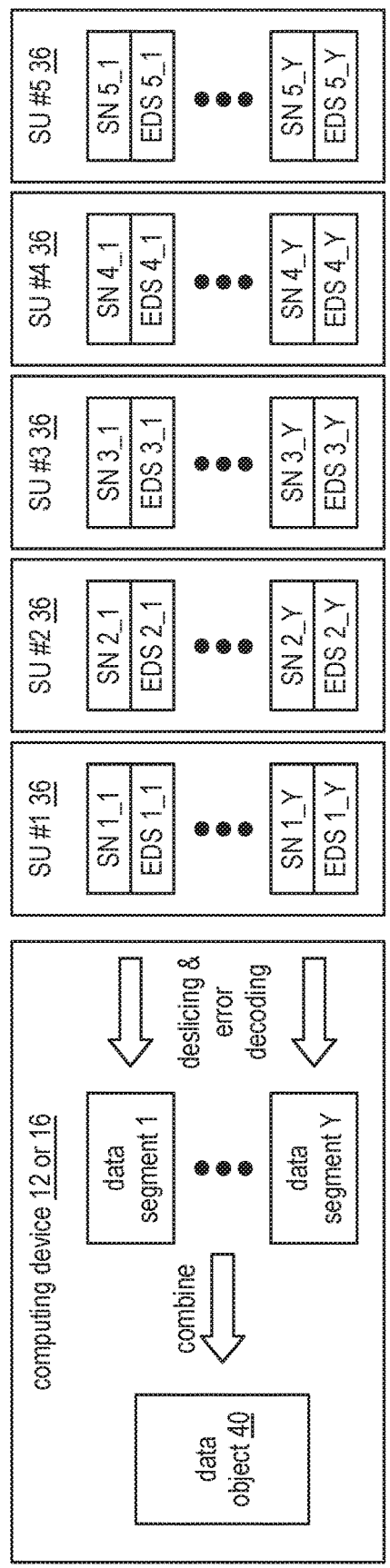
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
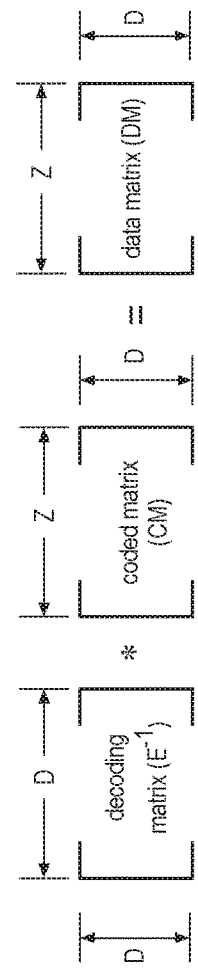
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
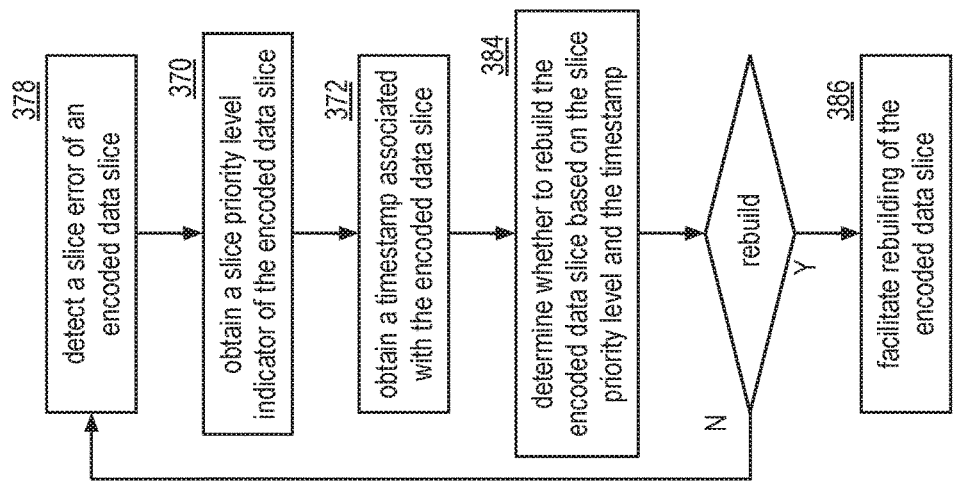
FIG. 9 is a logic diagram of an embodiment of a method of rebuilding prioritization accordance with the present invention.

FIG. 9 is a flowchart illustrating an example of rebuilding data stored in a dispersed storage network (DSN). Prior to step 378, a computing device of the DSN (e.g., one or more of devices 12, 16, 18, and 20) determines a data priority level for a data object to be stored in the DSN in accordance with dispersed storage error encoding parameters (e.g., an error coding algorithm, the width n [number of pillars X or slices per segment for this vault], a read threshold T, a write threshold, an encryption algorithm, a slicing parameter, a compression algorithm, an integrity check method, caching settings, parallelism settings, and/or other parameters that may be used to access the DSN memory layer). As an example, the computing device determines a data retention timeframe for storing the data object. The computing device then establishes the data priority level to be above the data priority threshold when the data retention timeframe is equal to or greater than an average retention timeframe and establishes it to be below the data priority threshold when the data retention timeframe is less than the average retention timeframe.

In addition, the computing device determines slice priority levels based on the data priority level. For example, when the data priority level is determined to be below the data priority threshold, the computing device establishes the first subset of encoded data slices to include a read threshold number of encoded data slices and the second subset of encoded data slices to include a number of encoded data slices equal to a total number less the read threshold number. As another example, when the data priority level is determined to be above the data priority threshold, the computing device establishes the first subset of encoded data slices to include a write threshold number of encoded data slices and the second subset of encoded data slices to include a number of encoded data slices equal to a total number less the write threshold number. As yet another example, the computing device determines that a third subset of encoded data slices has a third slice priority level. In this example, the first subset includes a read threshold number of encoded data slices, the second subset includes a number of encoded data slices equal to a write number less the read threshold number, and the third subset includes a number of encoded data slices equal to a total number less the write threshold number.

The computing device further encodes the data object in accordance with the dispersed storage error encoding parameters to produce a plurality of sets of encoded data slices and writes them to storage units of the DSN. While writing the plurality of sets of encoded data slices, a rebuilding module (e.g., one or more processing modules of one or more DS units 36, of the integrity unit 20, and/or of the managing unit 18) detects a slice error for an encoded data slice of the set of encoded data slices at step 378. The detecting includes at least one of detecting a missing slice, detecting a slice that fails an integrity check, and setting an error flag corresponding to a slice name of the encoded data slice.

The method continues with step 370 where the processing module of the computing device and/or the rebuilding module obtains a slice priority level indicator of the encoded data slice. The method continues at step 372 where the computing device and/or the rebuilding module obtains a timestamp associated with the encoded data slice.

The method continues at step 384 where the rebuilding module determines whether to rebuild the encoded data slice. For example, the rebuilding module determines to rebuild the encoded data slice when an amount of elapsed time since the timestamp is less than a time threshold corresponding to the slice priority level. For instance, the rebuilding module determines to rebuild the encoded data slice when 20 days has elapsed since the timestamp, the time threshold is 30 days, and the slice priority level is 3. As another instance, the rebuilding module determines not to rebuild the encoded data slice when 45 days has elapsed since the timestamp, the time threshold is 30, and the slice priority level is 9. As yet another instance, the rebuilding module determines to rebuild the encoded data slice when 1 day has elapsed since the timestamp, a time threshold is 10, and the slice priority level is 1.

As another example, the rebuilding module determines whether the encoded data slice has the first or the second slice priority level. When the data priority level is below a data priority threshold and the encoded data slice has the first slice priority level, the rebuilding module facilitates rebuilding of the encoded data slice (e.g., rebuilds the encoded data slice or requests another device to rebuild the encoded data slice). When the data priority level is below the data priority threshold and the encoded data slice has the second slice priority level, the rebuilding module foregoes rebuilding of the encoded data slice. As yet another example, when the data priority level is equal to or above the data priority threshold, the rebuilding module facilitates rebuilding of the encoded data slice.

As a further example, when the data priority level is between the data priority level and a second data priority threshold, the rebuilding module facilitates rebuilding of the encoded data slice when the encoded data slice has the first or the second slice priority level. When the encoded data slice has the third slice priority level, the rebuilding module foregoes rebuilding of the encoded data slice.

The method repeats back to step 378 when the rebuilding module determines not to rebuild the encoded data slice. The method continues at step 386 where the processing module facilitates rebuilding of the encoded data slice. The facilitating includes at least one of sending a rebuild request message to the DS unit associated with encoded data slice that includes a slice name of encoded data slice when the processing module is associated with a DS processing unit and rebuilding the encoded data slice when the processing module is associated with the DS unit. The rebuilding includes at least one of retrieving a decode threshold number of encoded data slices associated with the encoded data slice, decoding the least the decode threshold number of encoded data slices to produce a data segment, encoding the data segment to produce a rebuilt encoded data slice, storing the rebuilt encoded data slice, and resetting the error flag corresponding to the slice name of the encoded data slice. The method repeats back step 378.

Figure 10:
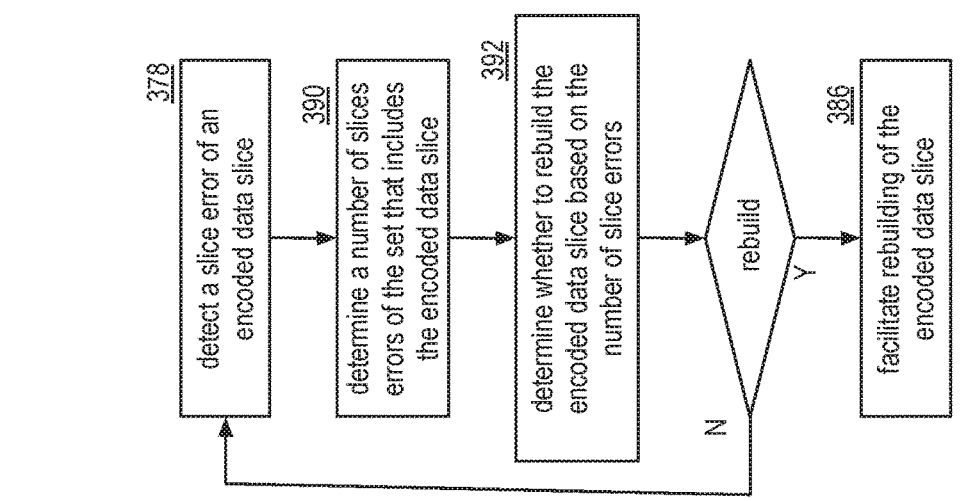
FIG. 10 is a logic diagram of another embodiment of a method of rebuilding prioritization accordance with the present invention.

FIG. 10 is a flowchart illustrating another example of rebuilding data stored in a dispersed storage network (DSN), which includes similar steps to FIG. 9. The method begins with step 378 of FIG. 9 where a processing module (e.g., a dispersed storage (DS) processing unit, a DS unit) detects a slice error of an encoded data slice. The method continues at step 390 where the processing module determines a number of slice errors of a set of encoded data slices that includes the encoded data slice. The determining may be based on one or more of obtaining slice names of the set of encoded data slices based on a slice name of the encoded data slice, querying DS units associated with the set of encoded data slices, and retrieving one or more slice error flags associated with the set of encoded data slices.

The method continues at step 392 where the processing module determines whether to rebuild the encoded data slice based on the number of slice errors. The determining may be based on one or more of comparing the number of slice errors to an error threshold, determining whether the comparison is favorable, and indicating to rebuild when the comparison is not favorable. For example, the processing module determines that the comparison is favorable when the number of slice errors is greater than the error threshold. The error threshold may range from one to n−k, wherein n=a pillar width and k=a decode threshold. For example, the error threshold may be set to just one slice error to provide a higher level of reliability. As another example, the error threshold may be set to 6 (e.g., 6=n−k, when the pillar width=16 and the decode threshold=10) to avoid utilizing system resources to rebuild the encoded data slice.

The method repeats back to step 378 of FIG. 9 when the processing module determines to not to rebuild the encoded data slice. The method continues to step 386 of FIG. 9 when the processing module determines to rebuild the encoded data slice. The method continues at step 386 of FIG. 9 where the processing module facilitates rebuilding of the encoded data slice. The method repeats back to step 378 of FIG. 9 where the processing module detects the slice error to look for further errors.

Figure 11:
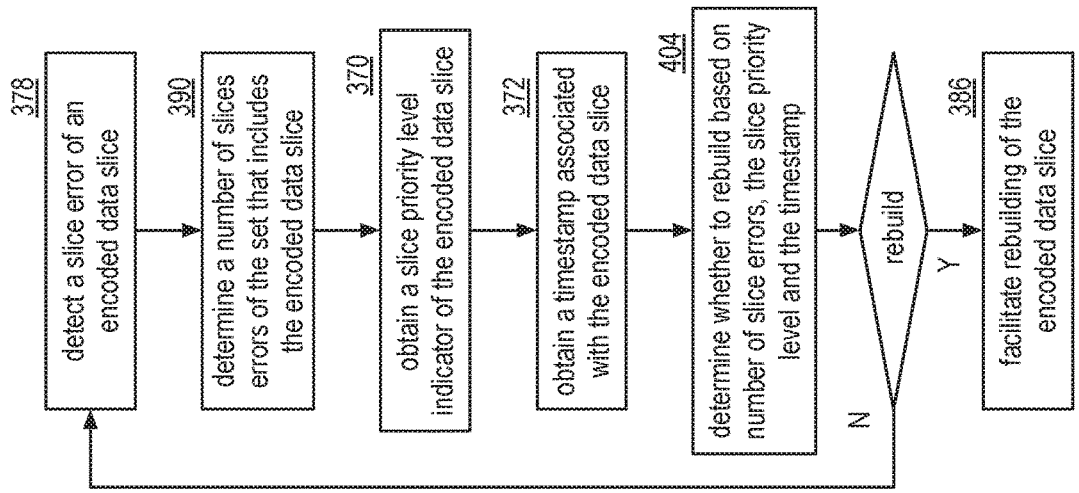
FIG. 11 is a logic diagram of another embodiment of a method of rebuilding prioritization accordance with the present invention.

FIG. 11 is a flowchart illustrating another example of rebuilding data stored in a dispersed storage network (DSN). The method begins with step 378 of FIG. 9 where a processing module (e.g., a dispersed storage (DS) processing unit, a DS unit) detects a slice error of an encoded data slice. The method continues with step 390 of FIG. 10 where the processing module determines a number of slice errors of a set of encoded data slices that includes the encoded data slice. The method continues with steps 370-372 where the processing module obtains a slice priority level indicator of the encoded data slice and obtains a timestamp associated with the encoded data slice.

The method continues at step 404 where the processing module determines whether to rebuild the encoded data slice based on the number of slice errors, the slice priority level indicator, and the timestamp. For example, the processing module determines to rebuild the encoded data slice when the number of slice errors is greater than a rebuild threshold corresponding to the slice priority level and an amount of elapsed time since the timestamp is less than a time threshold corresponding to the priority level. The method repeats back to step 378 of FIG. 9 when the processing module determines not rebuild the encoded data slice. The method continues to step 386 of FIG. 9 when the processing module determines to rebuild the encoded data slice. The method continues with step 386 of FIG. 9 where the processing module facilitates rebuilding of the encoded data slice. The method repeats back to step 378 of FIG. 9 to look for further errors.

Figure 12:
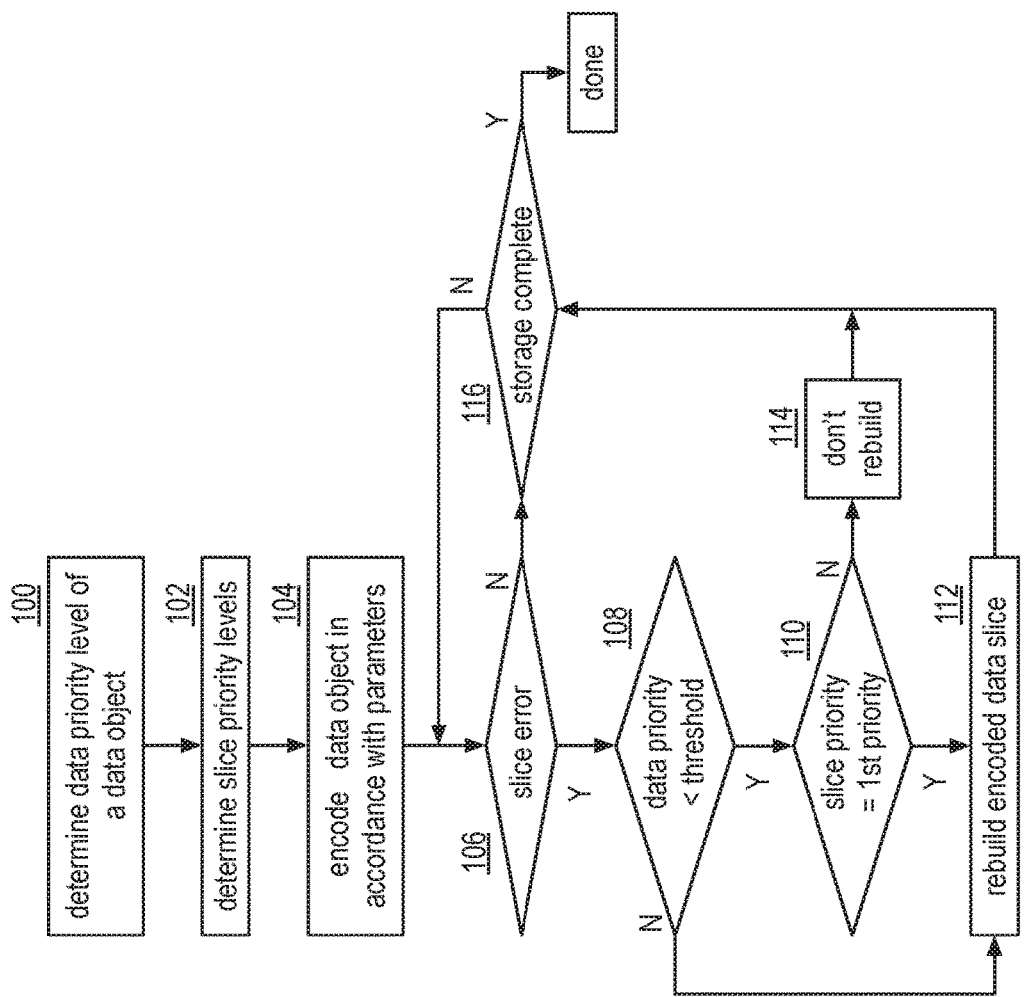
FIG. 12 is a logic diagram of another embodiment of a method of rebuilding prioritization accordance with the present invention.

FIG. 12 is a logic diagram of another embodiment of a method of rebuilding prioritization that begins at step 100 where a computing device determines a data priority level for a data object to be stored in the DSN in accordance with dispersed storage error encoding parameters. For example, the computing device determines a data retention timeframe for storing the data object (e.g., minutes, hours, days, months, years, in perpetuity). The computing device then establishes the data priority level to be above the data priority threshold when the data retention timeframe is equal to or greater than an average retention timeframe. For instance, when the average retention timeframe is 7 days, the data priority threshold is set to 7 days. If the data retention time frame is less than 7 days, the data priority is set below the data priority threshold and if it is above the threshold, it is set above the threshold. Note that the data priority threshold may be based on the average retention timeframe, may be selected by a system administrator, or some other mechanism.

The method continues at step 102 where the computing device determines slice priority levels based on the data priority level. For example, when the data priority level is below the data priority threshold, the computing device establishes a first subset of encoded data slices to include a read threshold number of encoded data slices and a second subset of encoded data slices to include a number of encoded data slices equal to a total number less the read threshold number. As another example, when the data priority level is above the data priority threshold, the computing device establishes the first subset of encoded data slices to include a write threshold number of encoded data slices and establishes the second subset of encoded data slices to include a number of encoded data slices equal to a total number less the write threshold number. Note that a data segment of the data object is encoded into a set of encoded data slices that is then divided into the first and second subsets.

The method continues at step 104 where the computing device encodes the data object in accordance with the dispersed storage error encoding parameters (e.g., total or pillar width number, decode threshold, read threshold, write threshold, error encoding function, etc.) to produce a plurality of sets of encoded data slices. Based on the slice priority levels, a first subset of encoded data slices has a first slice priority level and a second subset of encoded data slices has a second slice priority level.

The method continues with a rebuilding module (e.g., a module within the computing device, within a storage unit, or within another device of the DSN) in a detection mode for detecting a slice error for an encoded data slice as the plurality of sets of encoded data slices is written to the storage units. If no errors are found, the method ends. If an error is found (e.g., the encoded data slice was not properly stored by a storage unit), method continues at step 108 where the rebuilding module determines whether the encoded data slice has the first or the second slice priority level. When the data priority level is above a data priority threshold (i.e., not below the threshold), the method continues at step 112 where the rebuilding module facilitates rebuilding of the encoded data slice (e.g., flags the encoded data slices for rebuilding and/or rebuilds the encoded data slice).

When the data priority level is below the data priority threshold, the method continues at step 110 wherein the rebuilding module determines the slice priority level for the encoded data slice. When the has the first slice priority level, the method continues at step 112 where the rebuilding module facilitates rebuilding of the encoded data slice. When the has the second slice priority level, the method continues at step 114 where the rebuilding module foregoes rebuilding of the encoded data slice.

Figure 13:
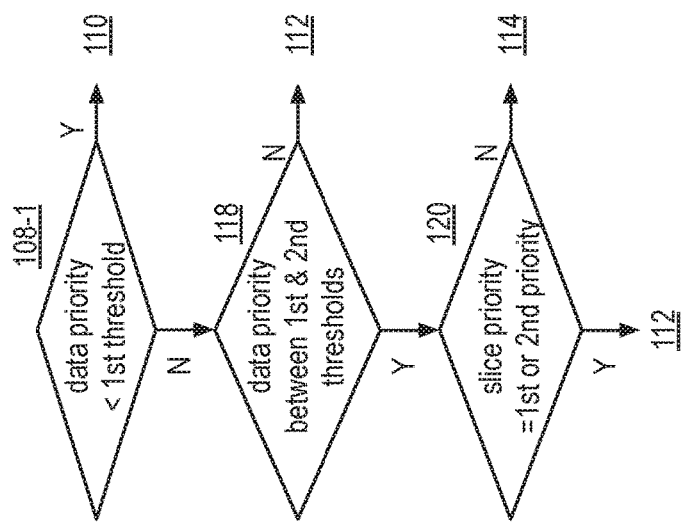
FIG. 13 is a logic diagram of another embodiment of a method of rebuilding prioritization accordance with the present invention.

FIG. 13 is a logic diagram of another embodiment of a method of rebuilding prioritization that expands on the method of FIG. 12. In this embodiment, the data object priority level is compared against two data priority thresholds and the set of encoded data slices is divided into three subsets. For example, the first subset of encoded data slices includes a read threshold number of encoded data slices, the second subset of encoded data slices includes a number of encoded data slices equal to a write number less the read threshold number, and the third subset of encoded data slices includes a number of encoded data slices equal to a total number less the write threshold number.

In this embodiment, when the rebuilding module detects a slice error, the method continues at step 108-1 where the rebuilding module determines whether the data priority level of the data object is below the first threshold (e.g., data retention for a week). If yes, the method continues at step 110 of FIG. 12 where the encoded data slice is rebuilt if it has a first slice priority level.

If the data priority level of the data object is not below the first threshold, the method continues at step 118 where the rebuild module determines whether the data priority level is between the first threshold and a second threshold (e.g., data retention for a month). If not (meaning the data retention for the data object is longer than the second threshold), the method continues at step 112 of FIG. 12 where the encoded data slice is rebuilt.

If the data priority level of the data object is between the first threshold and a second threshold, the method continues at step 120 where the rebuilding module determines whether the encoded data slices has the first or second priority levels. If yes, the encoded data slice is rebuilt. If not, the rebuilding module foregoes rebuilding of the encoded data slice.

Figure 14:
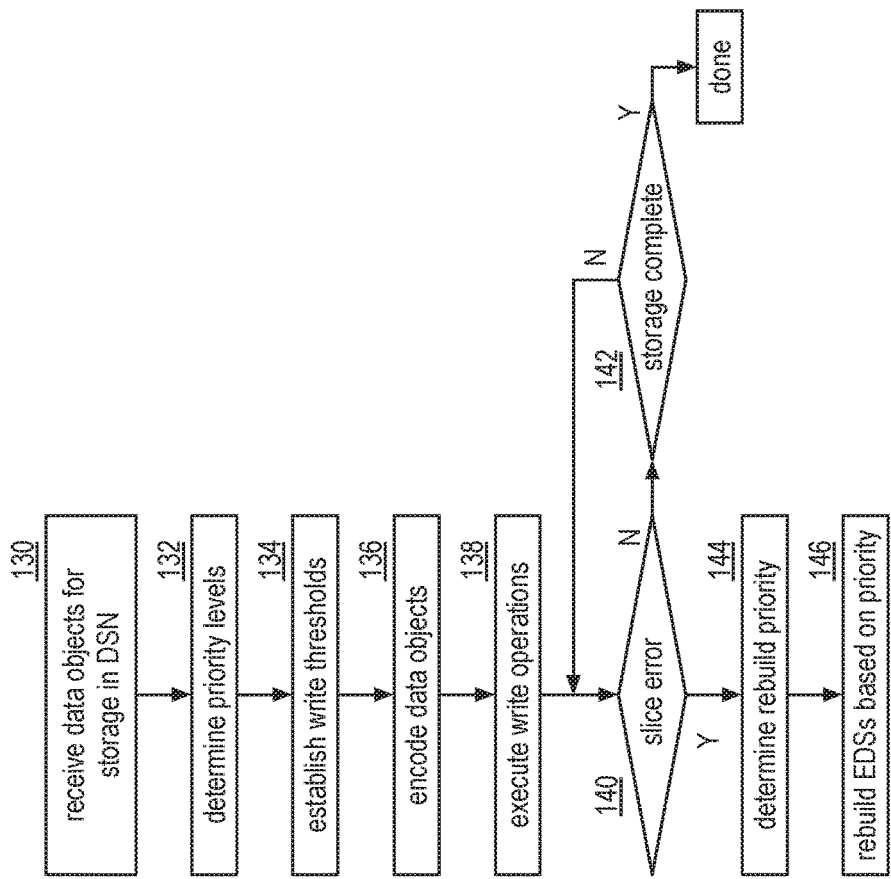
FIG. 14 is a logic diagram of another embodiment of a method of rebuilding prioritization accordance with the present invention.

FIG. 14 is a logic diagram of another embodiment of a method of rebuilding prioritization that begins at step 130 where a computing device receives a plurality of data objects at substantially the same time (e.g., received from a single source or multiple sources in a given timeframe (e.g., less than a second to a minute or more)) for storage in the DSN. The method continues at step 132 where the computing device determines a priority level for each of at least some of the plurality of data objects to produce a plurality of priority levels. For example, the computing device determines, for a first data object of the plurality of data objects, one or more of: a length of data retention, a data type of the first data object (such as characterization, source, vault id, etc.), and an analysis protocol (e.g., what is to be done with the data once stored and an approximation of processing resources and time). The example continues with the computing device, determining a first priority level for the first data object based on the determination of the one or more of: the length of data retention, the data type of the first data object, and the analysis protocol. The computing device performs a similar process for the other data objects.

The method continues at step 134 where the computing device determines, based on the plurality of priority levels, a write threshold for encoding each of at least some of the plurality of data objects to produce a plurality of write thresholds. For example, the computing device ranks the plurality of priority levels and determines estimated write operation costs (resources and time) to execute the plurality of write operations. For the first data object, the computing device determines its rank order (e.g., its priority with respect to the priority of the other data objects). The higher the priority ranking, the higher the write threshold. Note that the write threshold can be set to a number between the decode threshold and the total number of pillar width of a set of encoded data slices. As such, many data objects will share the same write threshold number, with the higher priority data objects having a larger write threshold than lower priority data objects.

The method continues at step 136 where the computing device dispersed storage error encodes plurality of data objects to produce pluralities of sets of encoded data slices. Note that a data object of the plurality of data objects is encoded into a plurality of sets of encoded data slices of the pluralities of sets of encoded data slices.

The method continues at step 138 where the computing device executes a plurality of write operations to store the pluralities of sets of encoded data slices in storage units of the DSN in accordance with the plurality of write thresholds. For example, the computing device issues a set of write requests regarding a set of encoded data slices of the pluralities of sets of encoded data slices to a set of the storage units. The computing device then receives write responses from at least some storage units of the set of the storage units in response to the set of write requests. When a corresponding write threshold (e.g., the write threshold number for the particular data object) of write responses have been received, the computing device computing device issues a set of write commit requests to the at least some storage units. The computing device then receives write commit responses from the at least some storage units in response to the set of write commit requests. When the corresponding write threshold of write commit responses have been received, the computing device issues a set of write finalize requests to the at least some storage units.

During the execution of the write operations, the method continues at step 140 where a rebuilding detection module of the DSN (e.g., a module in the computing device, a module in a storage unit, etc.) enters a mode to identify encoded data slices of the pluralities of sets of encoded data slices that were not properly stored (e.g., a storage unit did not successfully store an encoded data slice that was written to it). If no slice error occur, the method continues at step 142 where the process either loops back to check for slice errors or ends.

As an example, the rebuilding detection module identifies encoded data slices that were not properly stored when a storage unit of the set of the storage units does not provide a write response. As another example, the rebuilding detection module identifies encoded data slices that were not properly stored when a storage unit of the set of the storage units does not provide a write commit response.

When a slice error is detected, the method continues at step 144 where the rebuilding detection module determines rebuild priority for each encoded data slice having a slice error based on a corresponding one of the plurality of priority levels and a level of write success of a corresponding set of encoded data slices of the pluralities of sets of encoded data slices. For example, the rebuilding detection module determines the rebuild priority for a first encoded data slice that was not properly stored by determining a priority level of its data object. The rebuilding detection module then determines whether the encoded data slices that were not properly stored includes one or more other encoded data slices of the first set of encoded data slices. For instance, for a set of encoded data slices, how many encoded data slices were not successfully stored. The rebuilding detection module then establishes a first level of write success for the set of encoded data slices. The more encoded data slices not properly stored, the higher the priority to rebuild at least some of the slices not properly stored. The rebuilding detection module then establishes a rebuild priority for first encoded data slice based on the first priority level and the first level of write success.

The method continues at step 146 where a rebuilding module of the DSN (e.g., a module in the computing device, a module in a storage unit, etc.) rebuilds at least some of the encoded data slices based on the plurality of rebuild priorities. For instance, the rebuilding module rebuilds encoded data slices for high priority data objects and/or when the write success of other encoded data slices of a set of encoded data slices was low.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
    receiving, by a computing device of a dispersed storage network (DSN), a plurality of data objects for storage in the DSN, the plurality of data objects received during a timeframe in which processing of the plurality of data objects would require concurrent use of one or more DSN resources;
    determining, by the computing device, a priority level for each of at least some of the plurality of data objects to produce a plurality of priority levels;
    based on the plurality of priority levels, establishing, by the computing device, a write threshold for encoding each of at least some of the plurality of data objects to produce a plurality of write thresholds;
    dispersed storage error encoding, by the computing device, the plurality of data objects to produce pluralities of sets of encoded data slices, wherein a data object of the plurality of data objects is encoded into a plurality of sets of encoded data slices of the pluralities of sets of encoded data slices;
    executing, by the computing device, a plurality of write operations to store the pluralities of sets of encoded data slices in storage units of the DSN in accordance with the plurality of write thresholds;
    during the execution of the write operations, identifying, by a rebuilding detection module of the DSN, encoded data slices of the pluralities of sets of encoded data slices that were not properly stored;
    determining, by the rebuilding detection module, rebuild priority of each of the encoded data slices based on a corresponding one of the plurality of priority levels and a level of write success of a corresponding set of encoded data slices of the pluralities of sets of encoded data slices to produce a plurality of rebuild priorities; and
    rebuilding, by a rebuilding module of the DSN, at least some of the encoded data slices based on the plurality of rebuild priorities.

2. The method of claim 1, wherein determining the priority level comprises:
    determining, for a first data object of the plurality of data objects, one or more of: a length of data retention, a data type of the first data object, and an analysis protocol; and
    based on the determination of the one or more of: the length of data retention, the data type of the first data object, and the analysis protocol, determining, by the computing device, a first priority level for the first data object.

3. The method of claim 1, wherein the establishing the write threshold comprises:
    ranking the plurality of priority levels;
    determining estimated write operation costs to execute the plurality of write operations;
    determining, for a first data object of the plurality of data objects, a rank order for a first priority level of the first data object; and
    determining a first write threshold of the plurality of write thresholds for the first data object based on the rank order of the first priority level and the estimated write operation costs.

4. The method of claim 1, wherein the executing a write operation of the plurality of write operations comprises:
    issuing, by the computing device, a set of write requests regarding a set of encoded data slices of the pluralities of sets of encoded data slices to a set of the storage units;
    receiving, by the computing device, write responses from at least some storage units of the set of the storage units in response to the set of write requests;
    when a corresponding write threshold of the plurality of write thresholds number of write responses have been received, issuing, by the computing device, a set of write commit requests to the at least some storage units;
    receiving, by the computing device, write commit responses from the at least some storage units in response to the set of write commit requests; and
    when the corresponding write threshold of write commit responses have been received, issuing, by the computing device, a set of write finalize requests to the at least some storage units.

5. The method of claim 4, wherein the identifying encoded data slices that were not properly stored comprises:
    when a first storage unit of the set of the storage units does not provide a write response, identifying an encoded data slice to be stored by the first storage unit to include in the encoded data slices that were not properly stored; and when a second storage unit of the set of the storage units does not provide a write commit response, identifying an encoded data slice to be stored by the second storage unit to include in the encoded data slices that were not properly stored.

6. The method of claim 1, wherein the determining rebuild priority comprises:

for a first encoded data slice of the encoded data slices that were not properly stored:

determining a first priority level of the plurality of priority levels of a first data object of the plurality of data objects, wherein the first data object is dispersed storage error encoded into a first plurality of sets of encoded data slices, wherein the first encoded data slice is from a first set of encoded data slices of the first plurality of sets of encoded data slices;

determining whether the encoded data slices that were not properly stored includes one or more other encoded data slices of the first set of encoded data slices;

establishing a first level of write success for the first set of encoded data slices based on the first encoded data slice and whether the encoded data slices that were not properly stored includes one or more other encoded data slices of the first set of encoded data slices; and establishing a first rebuild priority for the first encoded data slice based on the first priority level and the first level of write success.

7. A non-transitory computer readable memory comprises:

a first memory section that stores operational instructions that, when executed by a computing device of a dispersed storage network (DSN), causes the computing device to:

receive a plurality of data objects for storage in the DSN, the plurality of data objects received during a timeframe in which processing of the plurality of data objects would require concurrent use of one or more DSN resources;

determine a priority level for each of at least some of the plurality of data objects to produce a plurality of priority levels;

based on the plurality of priority levels, establish a write threshold for encoding each of at least some of the plurality of data objects to produce a plurality of write thresholds;

dispersed storage error encode the plurality of data objects to produce pluralities of sets of encoded data slices, wherein a data object of the plurality of data objects is encoded into a plurality of sets of encoded data slices of the pluralities of sets of encoded data slices; and execute a plurality of write operations to store the pluralities of sets of encoded data slices in storage units of the DSN in accordance with the plurality of write thresholds;

a second memory section that stores operational instructions that, when executed by a rebuilding detection module of the DSN, causes the rebuilding detection module to:

during the execution of the write operations, identify encoded data slices of the pluralities of sets of encoded data slices that were not properly stored; and determine rebuild priority of each of the encoded data slices based on a corresponding one of the plurality of priority levels and a level of write success of a corresponding set of encoded data slices of the pluralities of sets of encoded data slices to produce a plurality of rebuild priorities; and a third memory section that stores operational instructions that, when executed by a rebuilding module of the DSN, causes the rebuilding module to:

rebuild at least some of the encoded data slices based on the plurality of rebuild priorities.

8. The non-transitory computer readable memory of claim 7, wherein the first memory section further stores operational instructions that, when executed by the computing device, causes the computing device to determine the priority level by:

determining, for a first data object of the plurality of data objects, one or more of: a length of data retention, a data type of the first data object, and an analysis protocol; and based on the determination of the one or more of: the length of data retention, the data type of the first data object, and the analysis protocol, determining, by the computing device, a first priority level for the first data object.

9. The non-transitory computer readable memory of claim 7, wherein the first memory section further stores operational instructions that, when executed by the computing device, causes the computing device to establish the write threshold by:

ranking the plurality of priority levels;

determining estimated write operation costs to execute the plurality of write operations;

determining, for a first data object of the plurality of data objects, a rank order for a first priority level of the first data object; and determining a first write threshold of the plurality of write thresholds for the first data object based on the rank order of the first priority level and the estimated write operation costs.

10. The non-transitory computer readable memory of claim 7, wherein the first memory section further stores operational instructions that, when executed by the computing device, causes the computing device to execute a write operation of the plurality of write operations by:

issuing a set of write requests regarding a set of encoded data slices of the pluralities of sets of encoded data slices to a set of the storage units;

receiving write responses from at least some storage units of the set of the storage units in response to the set of write requests;

when a corresponding write threshold of the plurality of write thresholds number of write responses have been received, issuing a set of write commit requests to the at least some storage units;

receiving write commit responses from the at least some storage units in response to the set of write commit requests; and when the corresponding write threshold of write commit responses have been received, issuing a set of write finalize requests to the at least some storage units.

11. The non-transitory computer readable memory of claim 10, wherein the second memory section further stores operational instructions that, when executed by the rebuilding detection module, causes the rebuilding detection module to identify the encoded data slices that were not properly stored by:

when a first storage unit of the set of the storage units does not provide a write response, identifying an encoded data slice to be stored by the first storage unit to include in the encoded data slices that were not properly stored; and when a second storage unit of the set of the storage units does not provide a write commit response, identifying an encoded data slice to be stored by the second storage unit to include in the encoded data slices that were not properly stored.

12. The non-transitory computer readable memory of claim 7, wherein the second memory section further stores operational instructions that, when executed by the rebuilding detection module, causes the rebuilding detection module to determine the rebuild priority by:

for a first encoded data slice of the encoded data slices that were not properly stored:

determining a first priority level of the plurality of priority levels of a first data object of the plurality of data objects, wherein the first data object is dispersed storage error encoded into a first plurality of sets of encoded data slices, wherein the first encoded data slice is from a first set of encoded data slices of the first plurality of sets of encoded data slices;

determining whether the encoded data slices that were not properly stored includes one or more other encoded data slices of the first set of encoded data slices;

establishing a first level of write success for the first set of encoded data slices based on the first encoded data slice and whether the encoded data slices that were not properly stored includes one or more other encoded data slices of the first set of encoded data slices; and establishing a first rebuild priority for the first encoded data slice based on the first priority level and the first level of write success.

* * * * *